United States Patent
Katz (10) Patent No.: US 7,167,698 B2
(45) Date of Patent: Jan. 23, 2007

(54) BALANCED SUB-HARMONIC MIXER

(75) Inventor: Richard H. Katz, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 381 days.

(21) Appl. No.: 10/290,934

(22) Filed: Nov. 7, 2002

(65) Prior Publication Data

US 2004/0092245 A1 May 13, 2004

(51) Int. Cl.
*H04B 1/26* (2006.01)

(52) U.S. Cl. ............... 455/326; 455/319; 455/333; 333/125

(58) Field of Classification Search ............... 455/327, 455/330, 319, 326, 323, 324, 325, 205, 208, 455/255, 550.1, 556.1, 318, 313, 333; 333/109, 333/117, 118, 112, 125, 128, 136
See application file for complete search history.

(56) References Cited

U.S. PATENT DOCUMENTS

| | | | | |
|---|---|---|---|---|
| 4,245,355 A | * | 1/1981 | Pascoe et al. ............... | 455/326 |
| 5,060,298 A | * | 10/1991 | Waugh et al. ............... | 455/326 |
| 5,339,462 A | * | 8/1994 | Staudinger et al. ......... | 455/330 |
| 5,416,449 A | * | 5/1995 | Joshi .......................... | 332/170 |
| 5,428,839 A | | 6/1995 | Friesen et al. | |
| 5,428,840 A | * | 6/1995 | Sadhir ......................... | 455/326 |
| 5,678,225 A | * | 10/1997 | Kobayashi ................... | 455/330 |
| 5,740,528 A | * | 4/1998 | Drennen ..................... | 455/327 |
| 6,094,570 A | | 7/2000 | Consolazio | |
| 6,317,590 B1 | * | 11/2001 | Nash et al. .................. | 455/331 |
| 6,348,830 B1 | | 2/2002 | Rebeiz et al. | |
| 6,370,372 B1 | | 4/2002 | Molnar et al. | |
| 6,374,093 B1 | * | 4/2002 | Pesola ....................... | 455/188.1 |
| 6,411,825 B1 | * | 6/2002 | Csapo et al. ................ | 455/561 |
| 6,427,069 B1 | | 7/2002 | Galin | |
| 6,725,029 B1 | * | 4/2004 | Allen .......................... | 455/302 |
| 2002/0049043 A1 | * | 4/2002 | Gamliel ....................... | 455/112 |
| 2003/0013426 A1 | * | 1/2003 | Kim et al. ................... | 455/196.1 |
| 2003/0020137 A1 | * | 1/2003 | Bosco et al. ................. | 257/531 |
| 2003/0100285 A1 | * | 5/2003 | Puglia ......................... | 455/293 |
| 2004/0130403 A1 | * | 7/2004 | Sewald .................... | 331/117 R |

* cited by examiner

*Primary Examiner*—Edward F. Urban
*Assistant Examiner*—Nhan T. Le
(74) *Attorney, Agent, or Firm*—Tarolli, Sundheim, Covell & Tummino LLP (57) ABSTRACT

A wide band mixer is provided that mitigates local oscillator leakage. A LO signal is provided to a 180 degree splitter that provides a first intermediate LO signal and a second intermediate LO signal 180° out of phase from one another. Since both the first and second intermediate LO signals are 180° out of phase, the fundamental LO leakage is mitigated at the RF port by the in-phase combination of the 180° out of phase LO tones canceling one another out and providing strong LO/RF rejection. An RF or microwave input signal is provided to a power splitter to provide a first intermediate RF signal and a second intermediate RF signal. The first intermediate LO signal is mixed with the first intermediate RF signal and the second intermediate LO signal is mixed with the second intermediate RF signal to provide an intermediate frequency signal at the output of the mixer.

23 Claims, 6 Drawing Sheets

BALANCED SUB-HARMONIC MIXER

TECHNICAL FIELD

The present invention relates generally to electronic circuits, and more particularly to circuits for mixing signals at different frequencies.

BACKGROUND OF THE INVENTION

Most radio frequency receivers convert received radio frequency (RF) signals to lower frequencies (e.g., baseband or intermediate frequencies) employing mixers. The filtering and amplification performed in processing the RF signal the lower frequencies is less expensive and more accurate than processing at the RF frequency. Typically, a modulated RF signal is combined in a mixer with a local oscillator (LO) signal to produce an intermediate frequency (IF) signal which can then be amplified and detected to recover the information modulated onto the RF carrier. The process can also be reversed by mixing a LO frequency signal with an IF signal to produce a modulated RF carrier that can be amplified and transmitted as a modulated signal.

A mixer is a nonlinear device containing either diodes or transistors, the function of which is to combine signals of two different frequencies in such a way as to produce energy at other frequencies. Various mixer parameters, such as bandwidth and inter-port isolation, must be optimized to produce devices capable of performing in modern RF systems. In recent years there has been an increase in sub-millimeter-wave receiver applications requiring easily producible and improved performance mixer technology at extremely high frequencies. Mixing an input RF signal with a LO signal yields frequency products below and above the RF and LO frequencies. Each frequency product corresponds to the sum of the input RF and LO frequencies, while the lower frequency product corresponds to the difference between the input RF and LO frequencies.

Some mixer types include single-ended, single-balanced, double-balanced, and double double-balanced (also called triple-balanced). All of these mixer types are three-port devices and comprise an input port (the RF port), a local oscillator input port (the LO port), and an output port (the IF port). Single-ended mixers are the simplest type and are realized using only a single diode. The LO, RF and IF ports are separated only by filters to provide some degree of inter-port isolation. Single-ended mixers, however, have a narrow bandwidth, limited dynamic range and poor inter-port isolation. Broader bandwidths and better isolation can be obtained with a single-balanced mixer. A single-balanced mixer consists of two single ended mixers. The mixer diodes are fed by the LO and RF signals. Harmonic mixers have been utilized in which the principal output is at a particular harmonic of the LO frequency. A more recent type of even sub-harmonic pumped mixer uses two diodes connected in parallel and opposing polarity, referred to as "antiparallel diodes". The sub-harmonic frequencies provide output frequencies as combination of only even harmonics of the local oscillator frequency.

Prior art mixers have a number of disadvantages well known in the art. Among these disadvantages are port-to-port isolation, limited bandwidth, particularly intermediate frequency bandwidth, relative complexity and difficulty of implementation in compact form suitable for incorporation in monolithic microwave integrated circuits (MMIC's). MMIC's are typically constructed using elemental semiconductor integrated circuit (IC) wafer processing technology on and/or in such wafers. Typically, broadband mixers are made with lumped elements or other structures that are compatible with IC fabrication techniques and geometries. In particular, it is important that they be of comparatively small size so as to not occupy disproportionately large substrate areas compared to the semiconductor diodes, transistors, etc., which mix the signals, or compared to the amplifiers or other signal processing elements that may be included in the MMIC. Such concerns are important in the frequency range above one GigaHertz (GHZ) where the sizes of distributed circuit elements are unwieldy. In particular, for broad-band applications, many lumped or distributed elements are employed which, in monolithic applications, require substantial die area. Therefore, conventional microwave mixers have limited bandwidth ranges resulting in customized mixers for radios that are designed to operate in specific bandwidths. A radio manufacturer of radios of varying bandwidths will then need to store multiple mixers of varying bandwidth, so as to meet the specific bandwidth requirements of the different radios.

Another problem with mixers is that the introduction of direct conversion receivers with their strong on-board LO signals present the problem of interference. More specifically, spurious LO leakage from the receiver into the antenna can cause in-band interference with other nearby receivers tuned to the same channel. Therefore, such a receiver would require a very high level of isolation between the local oscillator and the antenna in order to avoid swamping or saturating receivers of any nearby radios. Such high levels of isolation are very difficult to achieve due to stray capacitances directly coupling local oscillator energy into the antenna. Known methods addressing the problem of LO leakage include providing isolation in the RF path to the antenna, inserting an isolator such as filters on the mixer and, reducing the local oscillator drive power to very low levels. However, these methods have shortcomings, since they have been found to be detrimental to dynamic range and degrade sensitivity, as well as being expensive to implement and increasing die space.

Therefore, there continues to be a need for improved broadband mixers and methods of mixing signals that use fewer components, are easy to construct and/or employ elements that are readily integratable in and/or on MMIC's.

BRIEF SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

A wide band mixer and method is provided for mixing signals having different frequencies. The mixer and method comprise providing a local oscillator (LO) signal to a phase splitter (e.g., a 180 degree hybrid) that provides a first intermediate LO signal and a second intermediate LO signal 180° out of phase from one another. Since both the first and second intermediate LO signals are 180° out of phase, the fundamental LO leakage is mitigated at the RF port by the in-phase combination of the 180° out of phase LO tones canceling one another out. An RF or microwave input signal (e.g., about 1 GHZ to about 100 GHZ) is provided to a power splitter (e.g., a 3 dB power combiner/splitter) to provide a first intermediate RF signal and a second intermediate RF signal. Both the first intermediate RF signal and the second intermediate RF signal are in phase with the RF input signal and have a power level about one-half of the power level of the RF input signal. The first intermediate LO signal is mixed with the first intermediate RF signal and the second intermediate LO signal is mixed with the second intermediate RF signal. The mixed signals are combined to provide an intermediate frequency (IF) signal at the output of the mixer.

The power splitter and phase splitter can be selected to be wide band such that a wide band mixer is provided that can handle relatively high frequencies in the microwave frequency range (e.g., about 1 GHZ to about 100 GHZ). Furthermore, the power splitter and phase splitter provide the necessary isolation previously provided by filters and other components, thus enabling the mixer to be employed on a relatively small integrated circuit. The mixer can be a balanced sub-harmonic mixer employing a first pair of anti-parallel diodes to mix the first intermediate LO signal with the first intermediate RF signal and a second pair of anti-parallel diodes to mix the second intermediate LO signal with the second intermediate RF signal. The balanced sub-harmonic mixer provides output frequencies as a combination of only even harmonics of the LO frequency. The even harmonic frequencies of the LO intermediate signals are in phase with the RF signal.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to a wide band mixer topology that mitigates local oscillator (LO) leakage. The LO signal is provided to a 180 degree splitter (e.g., a 180 degree hybrid) that provides a first intermediate LO signal and a second intermediate LO signal 180° out of phase from one another. Since both the first and second intermediate LO signals are 180° out of phase, the fundamental LO leakage is mitigated at the RF port by the in-phase combination of the 180° out of phase LO tones canceling one another out and providing strong LO/RF rejection. An RF or microwave input signal (e.g., about 1 GHZ to about 100 GHZ) is provided to a power splitter (e.g., a 3 dB power combiner/splitter) to provide a first intermediate RF signal and a second intermediate RF signal. Both the first intermediate RF signal and the second intermediate RF signal are in phase with the RF input signal and have a power level about one-half of the power level of the RF input signal. The first intermediate LO signal is mixed with the first intermediate RF signal and the second intermediate LO signal is mixed with the second intermediate RF signal. The mixed signals are combined to provide an intermediate frequency (IF) signal at the output of the mixer.

Additionally, by employing a power splitter such as a 3 dB power combiner/splitter and a 180 degree splitter such as a 180 degree hybrid, a wide band mixer can be provided that can handle relatively high frequencies in the microwave frequency range above 1 GHZ (e.g., about 1 GHZ to about 100 GHZ) without employing a lumped element solution since the power splitter and the 180 degree splitter are by nature wide band. Furthermore, a 3 dB power combiner/splitter and a 180 degree splitter provide the necessary isolation previously provided by filters and other components, thus enabling the mixer to be employed on a relatively small integrated circuit. Therefore, a single part can be employed to cover multiple frequency bands.

In one aspect of the invention, the mixer is a balanced sub-harmonic mixer employing a first pair of anti-parallel diodes to mix the first intermediate LO signal with the first intermediate RF signal and a second pair of anti-parallel diodes to mix the second intermediate LO signal with the second intermediate RF signal. The balanced sub-harmonic mixer provides output frequencies as a combination of only even harmonics of the LO frequency. The outputs of the first pair and second pair of anti-parallel diodes are coupled to a common point to provide the IF signal at the output of the mixer. The common point acts as an RF and LO ground. The LO signal is provided to the anti-parallel diodes 180° out of phase. The $2^{nd}$ harmonic of the LO has its phased doubled, therefore, is in phase. For example, the first intermediate LO signal is at 0° and the $2^{nd}$ harmonic of 0° is 0°. Additionally, the second intermediate LO signal is at −180° and the $2^{nd}$ harmonic of −180° is −360° or 0°. Therefore, both the first and second intermediate LO signals at the second harmonic are in phase with the RF signal.

Figure 1:
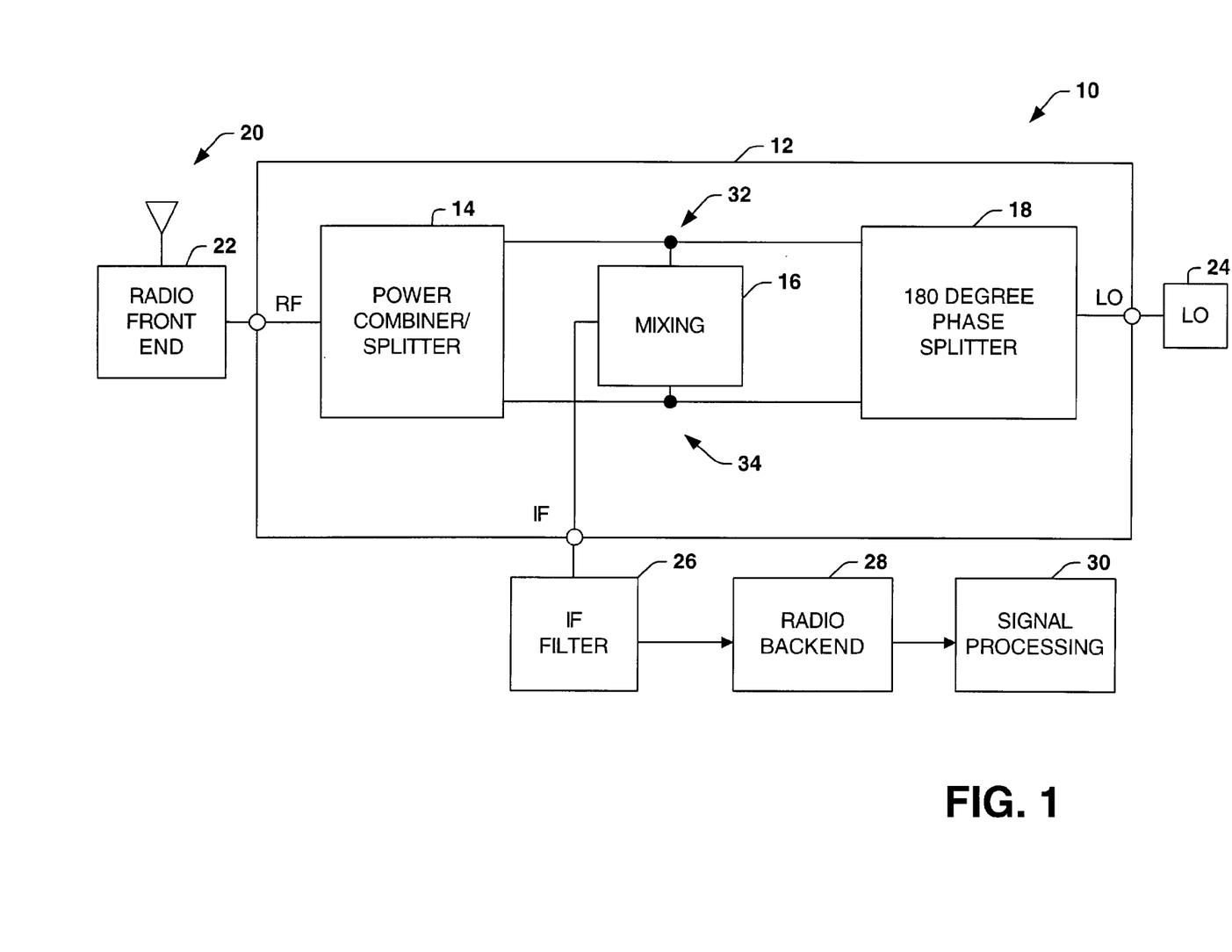
FIG. 1 illustrates a block diagram of a radio system employing a mixer in accordance with an aspect of the present invention.

FIG. 1 illustrates a radio system 10 employing a mixer 12 in accordance with an aspect of the present invention. The radio system 10 includes an antenna 20 coupled to a radio front end component 22. A RF or microwave input signal is received by the antenna 20, which captures the RF input signal and transmits the RF input signal to the radio front end component 12. The radio front end component 22 can amplify and filter the RF input signal to eliminate signals (e.g., noise, interference) that are outside of the desired frequency band. It is to be appreciated that many variations in radio front end processing exist. The RF input signal is then provided to an RF port of the mixer 12. The mixer 12 includes the RF port, a LO port and an IF port. A local oscillator 24 is coupled to the LO port and the radio front end component 22 is coupled to the RF port. The mixer 12 mixes the RF input signal and a LO input signal and provides an IF signal out of the IF port. Although, the mixer 12 is illustrated as part of a receiving portion of the radio system 10, it is to be appreciated that the mixer 12 can be employed in a transmitter portion of the radio system 10 by utilizing the IF port and the LO port as inputs and the RF port as an output.

The LO input signal is provided to a 180 degree phase splitter 18 (e.g., a 180 degree hybrid) that provides a first intermediate LO signal at a first node 32 and a second intermediate LO signal at a second node 34. The second intermediate LO signal is 180° out of phase from the first LO intermediate signal and the LO input signal. Since both the first and second intermediate LO signals are 180 degrees out of phase, the fundamental LO leakage is mitigated at the RF port by the in-phase combination of the 180° out of phase LO tones canceling one another out providing strong LO/RF rejection. The RF or microwave input signal is provided to a power splitter/combiner 14 to provide a first intermediate RF signal at the first node 32 and a second intermediate RF signal at the second node 34. Both the first intermediate RF signal and the second intermediate RF signal are in phase with the RF input signal and have a power level about one-half of the power level of the RF input signal. The first intermediate LO signal is mixed with the first intermediate RF signal and the second intermediate LO signal is mixed with the second intermediate RF signal at a mixing stage 16. The mixed signals are combined to provide an intermediate frequency (IF) signal at the IF port of the mixer 12. The IF signal is then provided to an IF filter 26, which removes unwanted signals from the IF signal. The filtered IF signal is then provided to a radio backend component 28 for further processing such as analog/digital conversion and demodulation. The signal is the provided to a signal processor 30 for final processing (e.g., decoding, data extraction).

Figure 2:
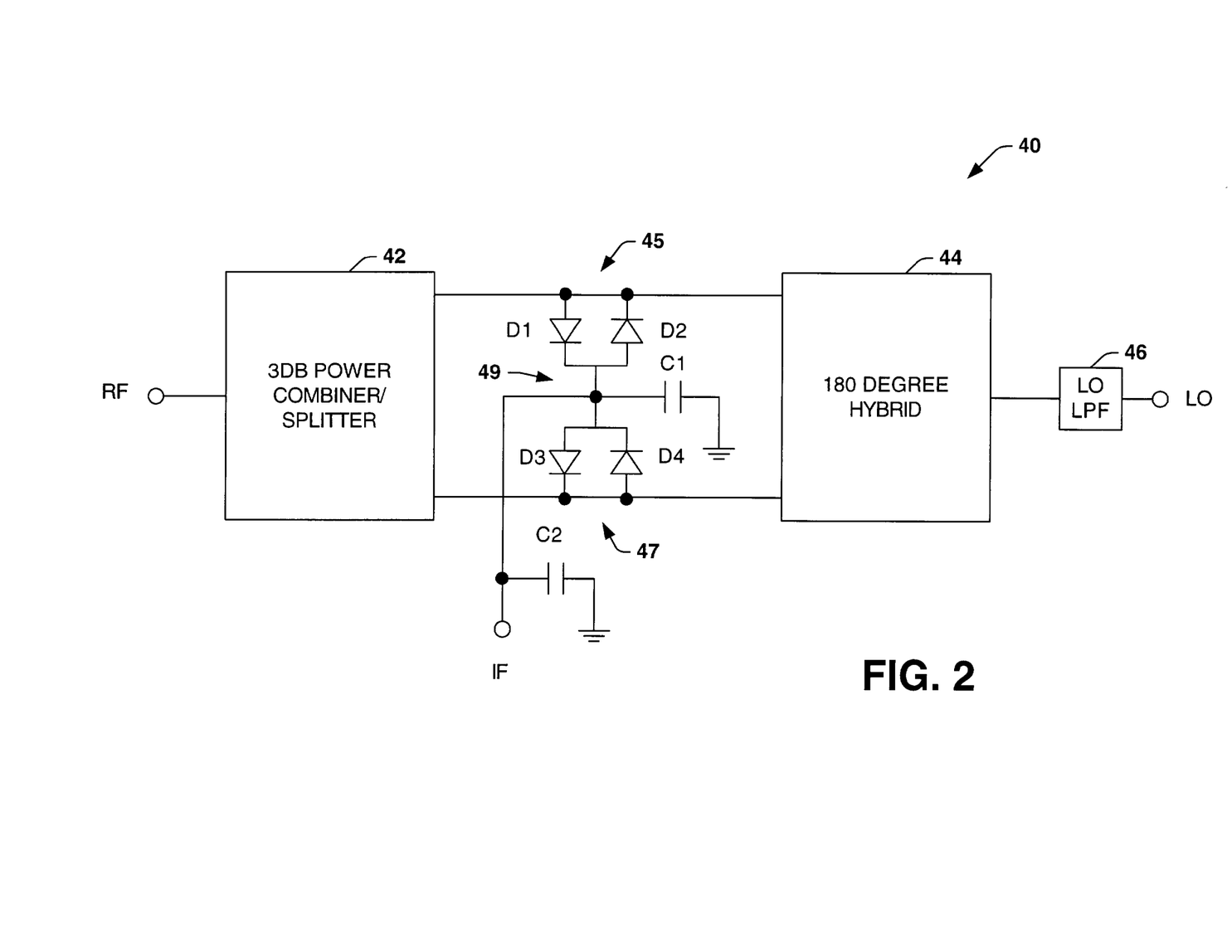
FIG. 2 illustrates a block diagram of a wide band balanced sub-harmonic mixer in accordance with an aspect of the present invention.

FIG. 2 illustrates a wide band balanced sub-harmonic mixer 40 in accordance with an aspect of the present invention. The mixer 40 includes a 3 dB power combiner/splitter 42 coupled to an RF port and a 180 degree hybrid 44 coupled to a LO port through an optional low pass filter 46. A 180 degree hybrid is a transformer or waveguide circuit arranged so that a signal entering at one terminal will divide and emerge from two adjacent terminals 180 out of phase. The 3 dB power combiner/splitter 42 receives an RF or microwave input signal and provides a first intermediate signal RF to a first node 45 and a second intermediate RF signal to a second node 47. Both the first intermediate RF signal and the second intermediate RF signal are in phase with the RF input signal and have a power level about one-half of the power level of the RF input signal. The 180 degree hybrid 44 receives a LO signal and provides a first intermediate LO signal to the first node 45 and a second intermediate LO signal to the second node 47. The second intermediate LO signal is 180° out of phase from the first LO intermediate signal and the LO input signal.

The mixer 40 includes a first anti-parallel diode pair comprised of diodes D1 and D2 and a second anti-parallel diode pair comprised of diodes D3 and D4. Diodes D1–D4 are, for example, schottky diodes. The first anti-parallel diode pair provides the mixing of the first intermediate RF signal with the first intermediate LO signal, and the second anti-parallel diode pair provides the mixing of the second intermediate RF signal with the second intermediate LO signal. The outputs of the first pair and second pair of anti-parallel diodes are coupled to a common node 49 to provide the IF signal at an IF port of the mixer 40. A first capacitor C1 couples the common node to ground and a second capacitor C2 is provided at the IF port to couple the IF port to ground. The common node 49 provides an RF and LO ground.

The balanced sub-harmonic mixer 40 provide output frequencies as a combination of only even harmonics of the LO frequency. The first intermediate LO signal is provided to the first anti-parallel diode pair in phase at 0° and since the $2^{nd}$ harmonic of the LO has its phased doubled, the second harmonic of the first intermediate LO signal is at 0° and in phase. The second intermediate LO signal is provided to the second anti-parallel diode pair out of phase at −180° and since the $2^{nd}$ harmonic of the LO has its phased doubled, the second harmonic of the second intermediate LO signal is at −360° or 0° and in phase. Therefore, both the first and second intermediate LO signals at the second harmonic are in phase with the fundamental frequency of the RF input signal and the first and second intermediate RF signals. The common node 49 is coupled to the IF port to provide the desired IF frequency signal. The frequency of the IF signal will be equal to the frequency of the RF input signal minus two times the frequency of the LO signal.

The 3 dB power combiner/splitter 42 and the 180 degree Hybrid 44 designs have inherently wide bands in addition to being able to handle high frequencies above 1 GHZ (e.g., about 1 GHZ to about 100 GHZ). Additionally, since the 3 dB power combiner/splitter 42 and the 180 degree Hybrid 44 provide the necessary isolation of the RF and LO signals, the number of components required to mix the RF and LO signals to provide the IF signal can be reduced. Therefore, the mixer 40 can be readily integrated onto an integrated circuit relatively small in size.

Figure 3:
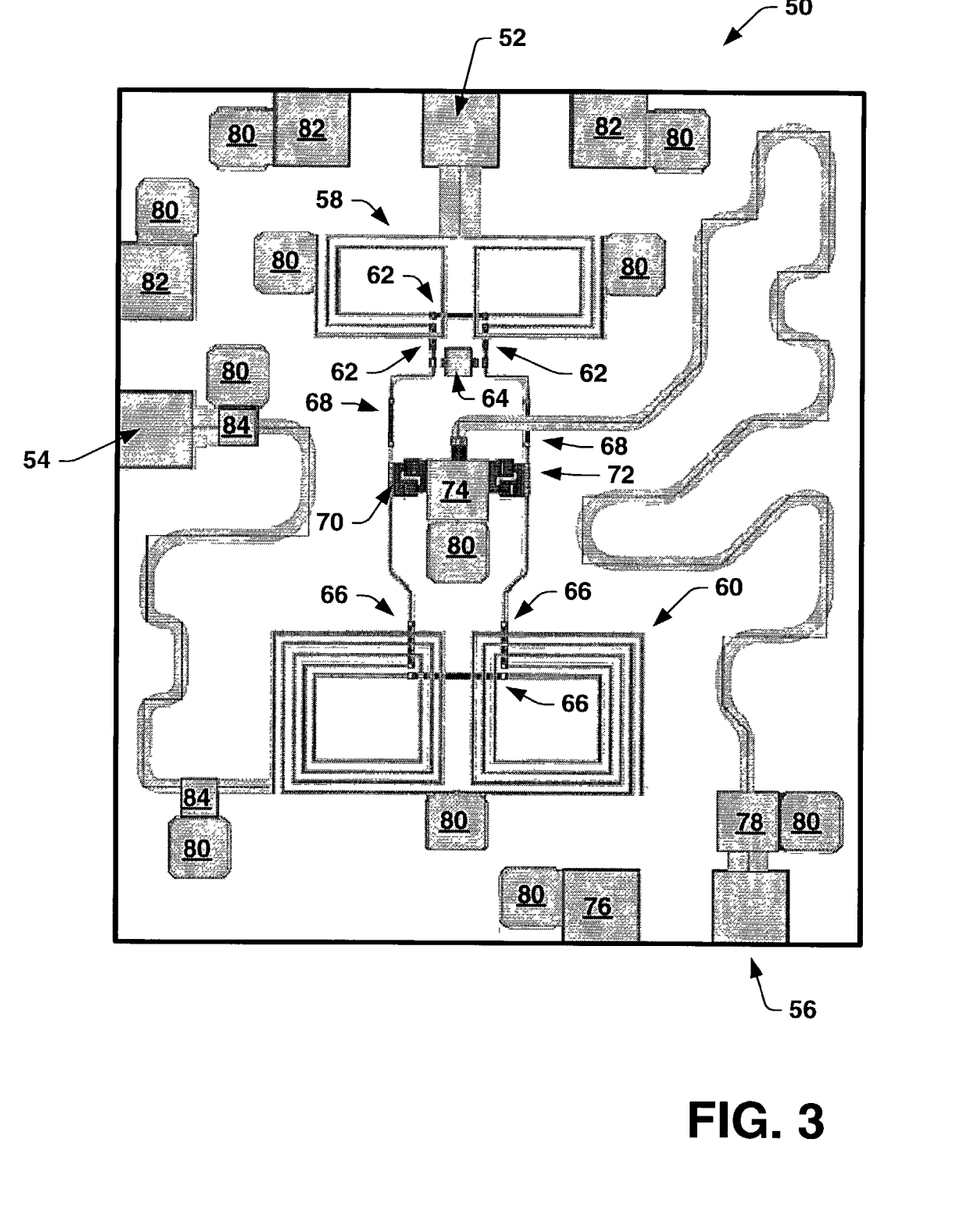
FIG. 3 illustrates a top enlarged view of a mixer provided on an integrated circuit in accordance with an aspect of the present invention.

FIG. 3 illustrates a mixer 50 provided on an integrated circuit in accordance with an aspect of the present invention. The mixer 50 employs a spiral balun power combiner/splitter 58 and can operate in a relatively wide band microwave range (e.g., about 20 GHZ to about 30 GHZ, about 37 GHZ to about 44 GHZ). Therefore, the mixer 50 can be employed in radios operating in different bands within the wide band microwave frequency range. For example, a mixer operating in a wide band microwave range of about 20 GHZ to about 30 GHZ can be employed in a radio operating in a band of 24–27 GHZ and also in a radio operating in a band of 27–30 GHZ. A mixer operating in a wide band microwave range of about 37 GHZ to about 44 GHZ can be employed in a radio operating in a band of 37–40 GHZ and also in a radio operating in a band of 40–44 GHZ. Therefore, a single part can be employed for radios in different operating bands.

In accordance with certain aspects of the invention, a balun structure is employed to provide the desired power splitting and phase splitting. A balun is a Balanced/unbalanced transformer device. A balun provides balanced outputs from an unbalanced input. Balanced output for wireless applications requires half the input signal amplitude at each of two output terminals, 180 degrees out of phase with each other. In principle, conventional transformer designs can produce this result. However, conventional transformer designs, typically wire wound devices, have an upper frequency limit of several hundred megahertz due to magnetic flux leakage and capacitive coupling between the windings. Current wireless applications require very high frequency operation at low power. Passive baluns provide high frequency operation without the high DC power consumption of active baluns. The known passive balun designs include spiral coil baluns which provide excellent balance and can be made in small, easily integrated, geometries. The spiral balun can be implemented using GaAs MMIC technology and two side-by-side spiral microstrip lines.

The mixer 50 includes an RF port 52 coupled to a first spiral balun structure configured to operate as a power combiner/splitter 58. The power combiner/splitter 58 includes a plurality of isolation resistors 62 in addition to an isolation capacitor 64. Two ports of the power combiner splitter 58 are coupled to ground pads 80. A first RF intermediate output port is coupled to a first anti-parallel diode pair 70 and a second RF intermediate output port is coupled to a second anti-parallel diode pair 72 through respective resistors 68. The first anti-parallel diode pair 70 and the second anti-parallel diode pair 72 are coupled to a common node. The common node is coupled to a ground pad 80 via a capacitor 74. The common node is also coupled to an IF port 56. A capacitor 78 couples the IF port 56 to a ground pad 80. A LO port is coupled to an input of a second spiral balun structure configured as a 180 degree Hybrid 60. One port of the 180 Degree hybrid is left open, while another port is coupled to a ground pad 80. A first LO intermediate output port is coupled to the first anti-parallel diode pair 70 and a second LO intermediate output port is coupled to the second anti-parallel diode pair 72. The integrated mixer circuit 50 includes a plurality of coupling capacitors 84, ground pads 80 and bond pads 82 as is conventional in the fabrication of integrated circuits.

In one aspect of the invention, the mixer 50 is operative to receive RF or microwave frequency signals in the range of about 20 GHZ to about 30 GHZ based on the selected design parameters of the power combiner/splitter 58 and the 180 degree Hybrid 60. A LO signal can be provided to the LO port which mixes the even harmonics of the LO signal with the RF fundamental frequencies. An intermediate frequency signal is then provided at the IF port. The intermediate frequency signal can then be filtered to remove unwanted even harmonic signals. The desired intermediate frequency signal can then be further demodulated and processed to recover the information modulated onto the RF carrier. In another aspect of the invention, the mixer 50 is operative to receive RF or microwave frequency signals in the range of about 37 GHZ to about 44 GHZ based on the selected design parameters of the power combiner/splitter 58 and the 180 degree hybrid 60. It is to be appreciated that the selected parameters of the wrapped balun structure power combiner/splitter can be modified to provide a wide band range for frequencies within ranges falling within about 1 GHZ to about 50 GHZ. The above mentioned selected parameters would be apparent to those skilled in the art of mixer designs.

Figure 4:
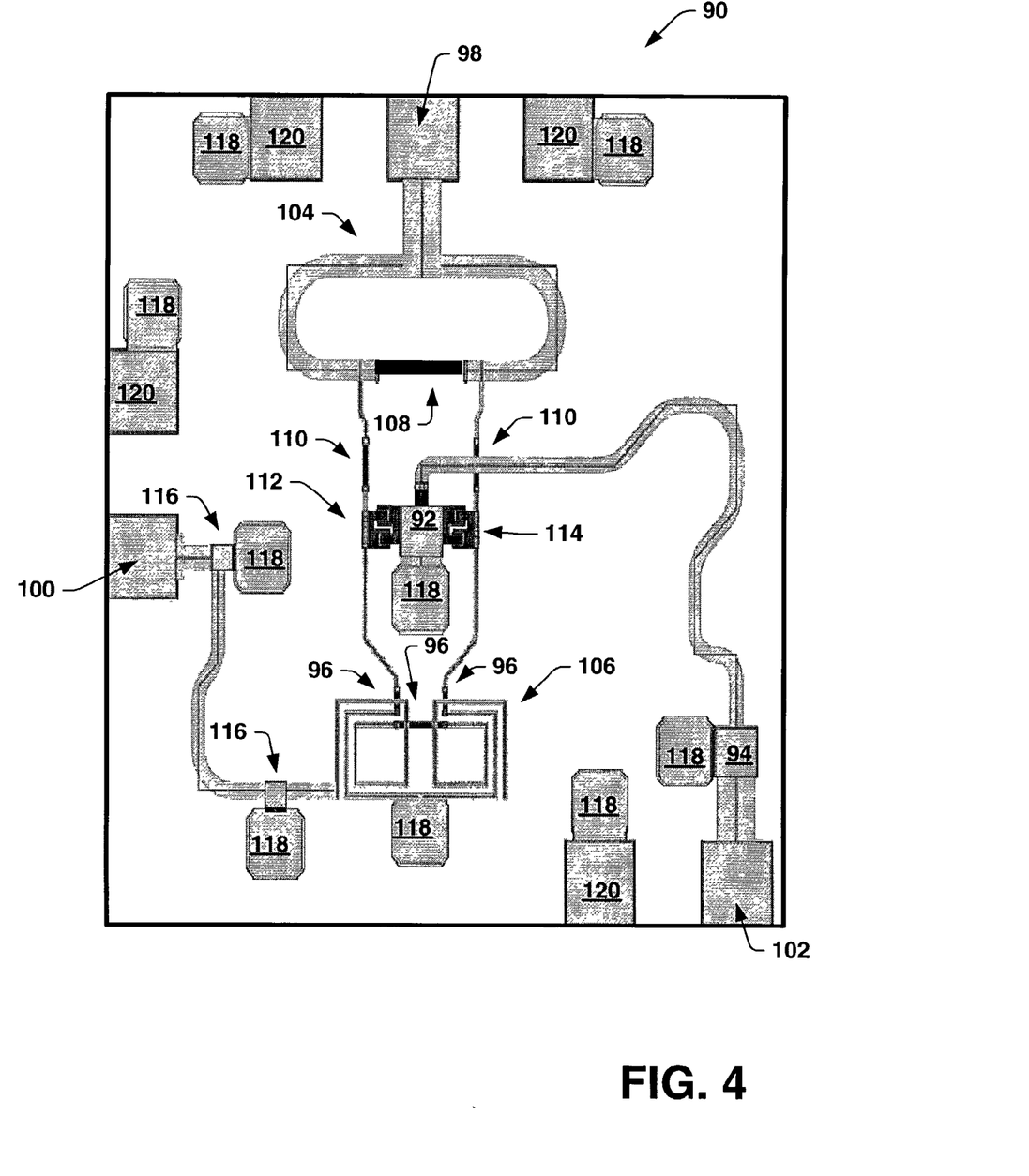
FIG. 4 illustrates a top enlarged view of a mixer provided on an integrated circuit in accordance with another aspect of the present invention.

FIG. 4 illustrates a mixer 90 provided on an integrated circuit in accordance with another aspect of the present invention. The mixer 90 employs a Wilkenson in-phase power combiner/splitter 104 and can operate in a relatively wide band microwave range (e.g., about 50 GHZ to about 70 GHZ, about 70 GHZ to about 80 GHZ). Therefore, the mixer 90 can be employed in radios operating in different bands within the wide band microwave frequency range. For example, a mixer operating in a wide band microwave range of about 50 GHZ to about 70 GHZ can be employed in a radio operating in a band of 57–60 GHZ, and also in a radio operating in a band of 60–65 GHZ. A mixer operating in a wide band microwave range of about 70 GHZ to about 80 GHZ can be employed in a radio operating in a band of 70–74 GHZ and also in a radio operating in a band of 75–80 GHZ. Therefore, a single part can be employed for radios in different operating bands.

The mixer 90 includes an RF port 98 coupled to a Wilkenson power combiner/splitter 104. The power combiner/splitter 104 includes an isolation resistor (e.g., 100 ohms). A first RF intermediate output port is coupled to a first anti-parallel diode pair 112 and a second RF intermediate output port is coupled to a second anti-parallel diode pair 114 through respective resistors 110. The first anti-parallel diode pair 112 and the second anti-parallel diode pair 114 are coupled to a common node. The common node is coupled to a ground pad 118 via a capacitor 92. The common node is also coupled to an IF port 102. A capacitor 94 couples the IF port 102 to a ground pad 118. A LO port 100 is coupled to an input of a spiral balun structure configured as a 180 degree hybrid 106. One port of the 180 degree hybrid is left open, while another port is coupled to a ground pad 118. A first LO intermediate output port is coupled to the first anti-parallel diode pair 112 and a second LO intermediate output port is coupled to the second anti-parallel diode pair 114. The integrated mixer circuit 90 includes a plurality of coupling capacitors 116, ground pads 118 and bond pads 120 as is conventional in the fabrication of integrated circuits.

In one aspect of the invention, the mixer 90 is operative to receive RF or microwave frequency signals in the range of about 50 GHZ to about 70 GHZ based on the selected design parameters of the Wilkenson power combiner/splitter 104 and the 180 degree hybrid 106. A LO signal can be provided to the LO port 100 which mixes the even harmonics of the LO signal with the RF fundamental frequencies. An intermediate frequency signal is then provided at the IF port 102. The intermediate frequency signal can then be filtered to remove unwanted even harmonic signals. The desired intermediate frequency signal can then be further demodulated and processed to recover the information modulated onto the RF carrier. In another aspect of the invention, the mixer 90 is operative to receive RF or microwave frequency signals in the range of about 70 GHZ to about 80 GHZ based on the selected design parameters of the Wilkenson power combiner/splitter 104 and the 180 degree hybrid 106. It is to be appreciated that the selected parameters of the Wilkenson power combiner/splitter 104 can be modified to provide a wide band range for frequencies within ranges falling within about 50 GHZ to about 1000 GHZ. Those selected parameters would be apparent to those skilled in the art of mixer designs.

Figure 5:
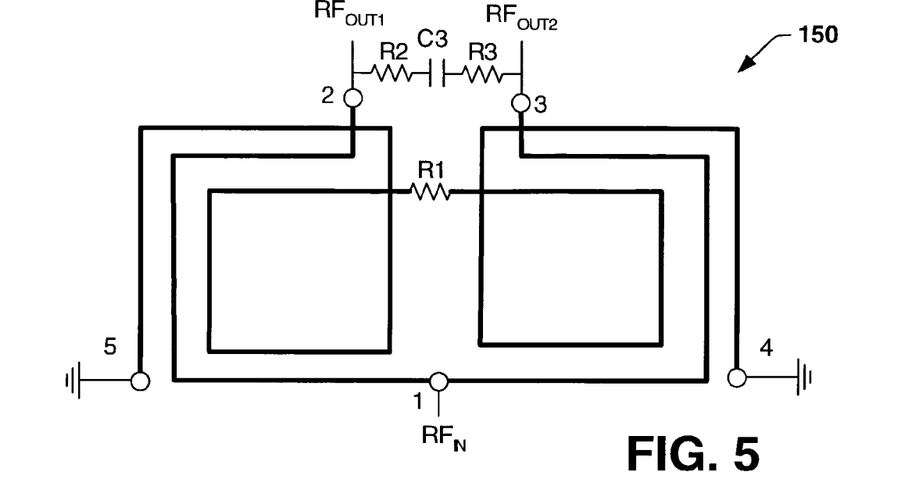
FIG. 5 illustrates a schematic diagram of a wrapped spiral balun structure configured to operate as a 3 dB power combiner/splitter in accordance with an aspect of the present invention.

FIG. 5 illustrates a wrapped spiral balun structure 150 configured to operate as a 3 dB power combiner/splitter in accordance with an aspect of the present invention. The wrapped spiral balun structure 150 includes a center tap that forms a first port (1) coupled to an $RF_{IN}$ signal source. A fourth port and a fifth port are coupled to ground. An isolation resistor R1 is coupled between the balun structure 150 to provide appropriate isolation for the balun structure 150. A second port (2) provides a first intermediate RF signal and a third port (3) provides a second intermediate RF signal which are both half of the power and in-phase with the RF input signal $RF_{IN}$. A series capacitor and resistor configuration R2, C2 and R3 are coupled in between the second port (2) and the third port (3) to tune the performance of the balun structure 150 and provide wide band performance with good return loss at all ports in addition to providing isolation between the second and third ports. The balun structure 150 is configured as a 3 dB power combiner/splitter that can operate within a wide band range for frequencies falling within ranges between about 1 GHZ to about 50 GHZ based on selected parameters (e.g., spiral microstrip line dimensions) of the wrapped spiral balun structure 150.

Figure 6:
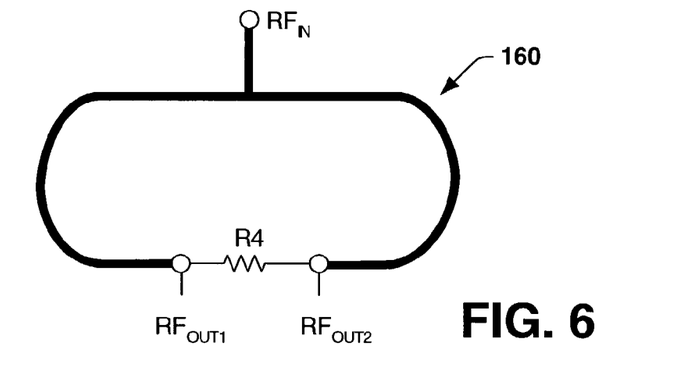
FIG. 6 illustrates a schematic diagram of a Wilkenson 3 dB power combiner/splitter in accordance with an aspect of the present invention.

FIG. 6 illustrates a Wilkenson 3 dB power combiner/splitter 160 in accordance with an aspect of the present invention. An input port is coupled to an $RF_{IN}$ signal source. The input port is coupled to a center area of a generally oval shaped configuration. A first semi-circular arm extends from the center area in a first direction and includes an end that provides a first output port, and a second semi-circular arm extends from the center area in a second direction and includes an end that provides a second output port. An isolation resistor R4 is coupled between the first output port and the second output port. The input impedance of the Wilkenson power combiner/splitter 160 is based on the input impedance of the Wilkenson power combiner/splitter 160 and the selected value of the resistor R4. The Wilkenson power combiner/splitter 160 is operative to receive an RF or microwave input signal at the input port and generate a first intermediate RF signal at the first output port and a second intermediate RF signal at the second output port which are both half of the power of the $RF_{IN}$ input signal and in phase with the $RF_{IN}$ input signal. The Wilkenson power combiner/splitter 160 can operate within a wide band range of substantially high frequencies falling within ranges between about 50 GHZ to about 100 GHZ based on selected parameters (e.g., arm length, arm thickness) of the Wilkenson power combiner/splitter 160.

Figure 7:
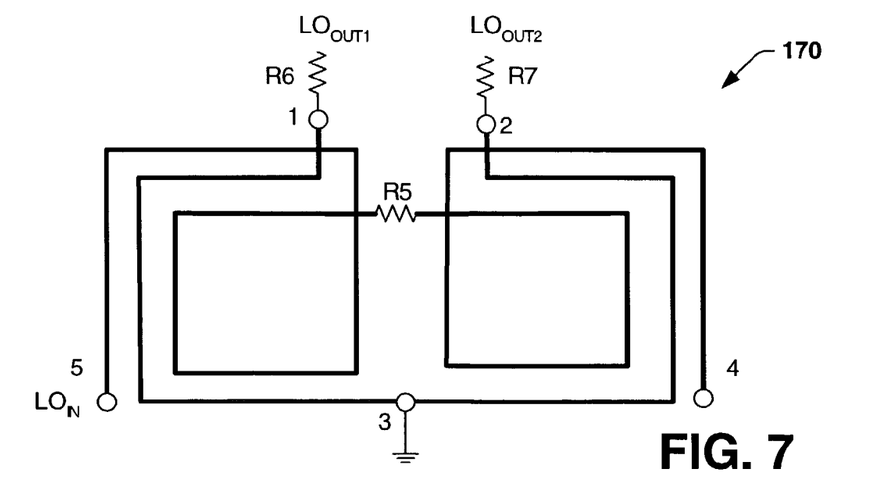
FIG. 7 illustrates a schematic diagram of a wrapped spiral balun structure configured to operate as a 180 degree hybrid in accordance with an aspect of the present invention.

FIG. 7 illustrates a wrapped spiral balun structure 170 configured to operate as a 180 degree hybrid in accordance with an aspect of the present invention. A fifth port (5) is coupled to a LO signal source $LO_{IN}$, while a center tap provides a third port (3) that is coupled to ground and a fourth port is left open. An isolation resistor R5 is coupled between the wrapped spiral balun structure 170 to provide appropriate isolation for the wrapped spiral balun structure 170. A first port (1) provide a first intermediate LO output signal $LO_{OUT1}$ through a resistor R6 in phase with the LO input signal $LO_{IN}$. A second output port (2) provides a second intermediate LO output signal $LO_{OUT2}$ through a resistor R7 that is 180° out of phase with the LO input signal $LO_{IN}$ and the first intermediate LO output signal $LO_{OUT1}$. The wrapped spiral balun structure 170 is operative to provide a 180 degree hybrid than can operate within a wide band range for frequencies falling within ranges between about 1 GHZ to about 100 GHZ based on selected parameters (e.g., spiral microstrip line dimensions) of the wrapped spiral balun structure 170.

Figure 8:
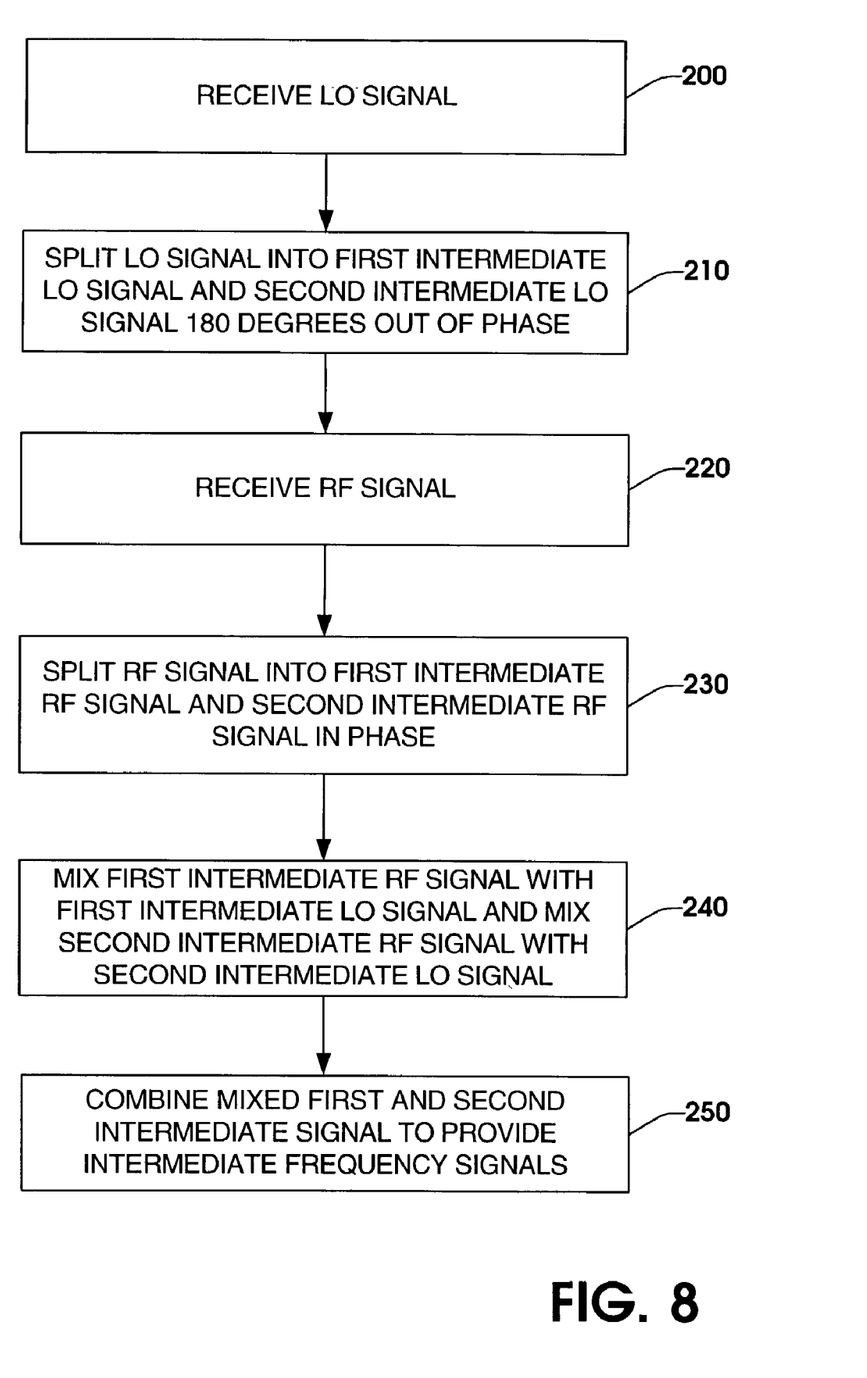
FIG. 8 illustrates a methodology for providing an intermediate frequency signal by mixing a RF input signal with a LO signal in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates a methodology for providing an intermediate frequency signal by mixing a RF input signal with a LO signal in accordance with an aspect of the present invention. The methodology begins at 200 where a LO input signal is received by a mixer, for example, at a LO port of a mixer. At 210, the LO input signal is split into a first intermediate LO signal and a second intermediate LO signal. The first intermediate LO signal is in phase with the LO input signal. The second intermediate LO signal is 180° out of phase with the LO input signal and the second intermediate LO signal. The first intermediate LO signal and the second intermediate LO signal can be provided employing a 180 degree phase splitter, such as an 180 degree hybrid. The methodology then proceeds to 220. At 220, an RF or microwave signal is received, for example, at an RF port of a mixer. The RF or microwave signal can be in a high frequency band range, such as a range within about 1 GHZ to about 100 GHZ. At 230, the RF or microwave signal is split into a first intermediate RF signal and a second intermediate RF signal. The first intermediate RF signal and a second intermediate RF signal are both half of the power and in-phase with the RF input signal. The first intermediate RF signal and a second intermediate RF signal can be provided by employing a 3 dB power combiner/splitter. The methodology then proceeds to 240.

At 240, the first intermediate RF signal and the first intermediate LO signal are mixed, for example, employing a mixing component such as a first anti-parallel diode pair. The second intermediate RF signal and the second intermediate LO signal are mixed, for example, employing a mixing component such as a second anti-parallel diode pair. If the mixing components are anti-parallel diode pairs, then the even harmonic frequencies of the intermediate LO signals are mixed with the intermediate RF signals. Additionally, since both the first and second intermediate LO signals are 180° out of phase, the fundamental LO leakage is mitigated at the RF port by the in-phase combination of the 180° out of phase LO tones canceling one another out providing strong LO/RF rejection. At 250, the mixed first and second intermediate signals are combined to provide an intermediate frequency signal. The intermediate frequency signal can provided at an IF port of a mixer.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

The invention claimed is:

1. A wide band mixer for mixing signals having different frequencies, the mixer comprising:
    a power splitter that receives a radio frequency (RF) input signal and generates a first intermediate RF signal and a second intermediate RF signal in phase with the RF input signal and having a power level about one-half the power level of the RF input signal;
    a phase splitter that receives a local oscillator (LO) input signal and generates a first intermediate LO signal and a second intermediate LO signal, the second intermediate signal is 180° out of phase with the first intermediate LO signal and the LO input signal; and
    a first anti-parallel diode pair that mixes the first intermediate RF signal with the first intermediate LO signal both first intermediate signals being received at a first end of the first anti-parallel diode pair and a second anti-parallel diode pair that mixes the second intermediate RF signal with the second intermediate LO signal both second intermediate signals being received at a first end of the second anti-parallel diode pair, the first and second anti-parallel diode pairs each having second ends as outputs coupled to a common node, the IF signal being provided at the common node.

2. The mixer of claim 1, the mixer being a sub-harmonic mixer such that the even harmonic frequencies of the LO signals are mixed with the fundamental frequency of the RF signals.

3. The mixer of claim 1, wherein the common node provides an RF and LO ground.

4. The mixer of claim 3, wherein the common node is coupled to a ground via a capacitor.

5. The mixer of claim 1, the power splitter being one of a wrapped spiral balun structure configured as a 3 dB power combiner/splitter and a Wilkenson 3 dB power combiner/splitter.

6. The mixer of claim 1, the mixer having a bandwidth in a frequency range from one of about 20 GHZ to about 30 GHZ, about 37 GHZ to about 44 GHZ, about 50 GHZ to about 70 GHZ and about 70 GHZ to about 80 GHZ.

7. The mixer of claim 1, the phase splitter being one of a wrapped spiral balun structure configured as a 180 degree hybrid.

8. An integrated circuit comprising the mixer of claim 1.

9. A radio system comprising the mixer of claim 1.

10. A multi-band sub-harmonic mixer for mixing signals having different frequencies, the sub-harmonic mixer comprising:
 a 3 db power splitter operative to receive a radio frequency (RF) input signal through an RF input port and generate a first intermediate RF signal at a first RF output port and a second intermediate RF signal at a second RF output port, the first intermediate RF signal and the second intermediate RF signal being in phase with the RF input signal and having a power level about one-half the power level of the RF input signal;
 a 180 degree hybrid operative to receive a local oscillator (LO) input signal at a LO input port and generate a first intermediate LO signal at a first LO output port and a second intermediate LO signal at a second LO output port, the second intermediate signal being 180° out of phase with the first intermediate LO signal and the LO input signal;
 a first anti-parallel diode pair coupled on a first end to the first RF output port and the first LO output port and on a second end to a common node; and
 a second anti-parallel diode pair coupled on a first end to the second RF output port and the second LO output port and on a second end to the common node, the common node being coupled to an intermediate frequency (IF) port.

11. The mixer of claim 10, the RF input signal having a frequency with a frequency range of about 1 GHZ to about 100 GHZ.

12. The mixer of claim 10, the first anti-parallel diode pair mixes the first intermediate RF signal with the first intermediate LO signal and the second anti-parallel diode pair mixes the second intermediate RF signal with the second intermediate LO signal.

13. The mixer of claim 10, the power splitter being one of a wrapped spiral balun structure configured as a 3 dB power combiner/splitter and a Wilkenson 3 dB power combiner/splitter.

14. The mixer of claim 10, the mixer having a bandwidth in a frequency range from one of about 20 GHZ to about 30 GHZ, about 37 GHZ to about 44 GHZ, about 50 GHZ to about 70 GHZ and about 70 GHZ to about 80 GHZ.

15. The mixer of claim 10, the 180 degree hybrid being formed from a wrapped spiral balun structure.

16. A method for mixing signals having different frequencies, the method comprising:
 receiving a local oscillator (LO) input signal;
 splitting the LO input signal into a first intermediate LO signal and a second intermediate LO signal, the second intermediate LO signal being 180° out of phase with the first intermediate LO signal and the LO input signal;
 receiving a radio frequency (RF) input signal;
 splitting the RF input signal into a first intermediate RF signal and a second intermediate RF signal, the first intermediate RF signal and the second intermediate RF signal being in phase with the RF input signal and having a power level of about half of the RF input signal;
 feeding the first intermediate RF signal and the first intermediate LO signal to an input of a first anti-parallel diode pair and feeding the second intermediate RF signal and the second intermediate LO signal to an input of a second anti-parallel diode pair; and
 outputting an intermediate frequency (IF) signal at a common node of both outputs of the first and second anti-parallel diode pair that is a mixed combination of the first intermediate RF signal and the first intermediate LO signal and the second intermediate RF signal and the second intermediate LO signal.

17. The method of claim 16, the RF input signal having a frequency with a frequency range of about 1 GHZ to about 100 GHZ.

18. The method of claim 16, the splitting the LO input signal into a first intermediate LO signal and a second intermediate LO signal comprising feeding the LO signal to a 180 degree hybrid.

19. The method of claim 18, splitting the RF input signal into a first intermediate RF signal and a second intermediate RF signal comprising feeding the RF input signal into a 3 dB power splitter.

20. The method of claim 18, wherein the common node provides an RF and LO ground.

21. A multi-band sub-harmonic mixer for mixing signals having different frequencies, the mixer sub-harmonic comprising:
 means for splitting a radio frequency (RF) input signal into a first intermediate RF signal and a second intermediate RF signal, the first intermediate RF signal and the second intermediate RF signal being in phase with the RF input signal and having a power level about one-half the power level of the RF input signal;
 means for splitting a local oscillator (LO) input signal into a first intermediate LO signal and a second intermediate LO signal, the second intermediate LO signal being 180° out of phase with the first intermediate LO signal and the LO input signal; and
 a first means for mixing the first intermediate RF signal with the even harmonics of the first intermediate LO signal both first intermediate signals being received at an input of the first means for mixing and a second means for mixing the second intermediate RF signal with the even harmonics of the second intermediate LO signal both second intermediate signals being received at an input of the second means for mixing, and combining the mixed intermediate signals to provide an intermediate frequency (IF) signal at a common node of an output of both the first means for mixing and the second means for mixing.

22. The mixer of claim 21, the RF input signal having a frequency with a frequency range of about 1 GHZ to about 100 GHZ.

23. The mixer of claim 21, wherein the common node provides an RF and LO ground.

* * * * *